(12) United States Patent
Schaffer

(10) Patent No.: US 7,315,459 B2
(45) Date of Patent: Jan. 1, 2008

(54) ELECTROMAGNETIC NOISE REDUCTION DEVICE

(75) Inventor: Michael J. Schaffer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 10/961,890

(22) Filed: Oct. 7, 2004

(65) Prior Publication Data

US 2005/0041358 A1    Feb. 24, 2005

Related U.S. Application Data

(63) Continuation of application No. 09/718,303, filed on Nov. 21, 2000.

(51) Int. Cl.
*H05K 9/00* (2006.01)
*H05K 1/11* (2006.01)

(52) U.S. Cl. ........................... 361/818; 361/792

(58) Field of Classification Search ........... 361/818, 361/816, 704, 709, 790–792; 174/35 R
See application file for complete search history.

(56) References Cited

U.S. PATENT DOCUMENTS

| | | | |
|---|---|---|---|
| 4,933,605 A | 6/1990 | Quazi et al. | |
| 5,457,300 A | 10/1995 | Karino et al. | |
| 5,638,895 A | 6/1997 | Dodson | |
| 5,703,416 A | 12/1997 | Hinkle et al. | |
| 6,044,899 A | 4/2000 | Langley et al. | |
| 6,122,169 A | 9/2000 | Liu et al. | |
| 6,134,505 A * | 10/2000 | Smith | 702/58 |
| 6,208,516 B1 | 3/2001 | Fangonilo et al. | |
| 6,243,680 B1 | 6/2001 | Gupta et al. | |
| 6,542,368 B2 * | 4/2003 | Miyazawa | 361/704 |
| 6,583,682 B1 * | 6/2003 | Dubhashi et al. | 333/12 |
| 6,819,572 B2 | 11/2004 | Schaffer | |
| 2003/0076266 A1 | 4/2003 | Schaffer | |

FOREIGN PATENT DOCUMENTS

| | | |
|---|---|---|
| DE | 197 18 649 A 1 | 11/1998 |
| EP | 0 853 340 A2 | 7/1998 |
| JP | 58214256 | 12/1983 |

OTHER PUBLICATIONS

U.S. Appl. No. 09/718,303, filed Nov. 21, 2000, Schaffer.

* cited by examiner

*Primary Examiner*—P. Austin Bradley
*Assistant Examiner*—Thanh S. Phan
(74) *Attorney, Agent, or Firm*—George Chen

(57) ABSTRACT

Briefly, in accordance with one embodiment of the invention, an electromagnetic interference (EMI) reduction device may include a circuit and at least one heatsink. The circuit may include analog devices coupled to reduce EMI signals received by the heatsink. The devices may be specifically adapted to substantially invert or phase-shift by 180° the EMI signals received by the heatsink.

10 Claims, 5 Drawing Sheets

ELECTROMAGNETIC NOISE REDUCTION DEVICE

RELATED APPLICATION

This is a continuation patent application of patent application Ser. No. 09/718,303, filed on Nov. 21, 2000, titled "Electromagnetic Noise Reduction Device," by Schaffer, assigned to the assignee of the present invention and herein incorporated by reference.

BACKGROUND

1. Field

The present disclosure relates to reducing electromagnetic interference (EMI) radiated by a heatsink and, more particularly, to a circuit for at least partially reducing such EMI.

2. Background Information

Electromagnetic interference (EMI) may be characterized as an interfering signal generated within or external to electronic equipment. Typical sources could be, for example, power-line transmissions, noise from switching devices, and/or spurious radiation from oscillators. EMI signals may, directly or indirectly, contribute to degradation in performance of an electronic receiver or system. In order to reduce degradation in performance of an electrical device by EMI, such as generated from a second electrical device, electronic equipment typically meets EMI levels set by the Federal Communications Commission (FCC) and the International Special Committee on Radio Interference (CISPR).

EMI emissions are usually a problem where the interfering signal travels from a source via a coupling path and radiates to a device. This device may have its performance thereby affected. To illustrate the concept, the following example may prove helpful. Of course, one skilled in the art will recognize that there are many other examples that may be used. In a computing system, EMI signals generated by a microprocessor, for example, may be transmitted to a heatsink coupled to the microprocessor. The heatsink, effectively acting as an antenna, may than radiate the received EMI signals. These radiated EMI signals may then degrade the performance of an electrical device within the affected range.

Typically, reduction of electromagnetic interference is attempted via passive technology, meaning here employing an inert component or method that may control, but not create or amplify energy. While these passive methods are typically inexpensive, at times they are ineffective or have been demonstrated to provide only limited success at reducing EMI signals. These methods, for example, may have inherent bandwidth limits and/or resonant points which may limit the frequencies of EMI signals that are capable of being reduced. In addition, if the source of the EMI signals is changed, due to a processor upgrade, for example, often a complete redesign of the passive method is called for to be effective. A need, therefore, exists for an improved circuit configuration or technique for implementing an electromagnetic noise suppression device.

BRIEF DESCRIPTION OF THE DRAWINGS

The subject matter regarded as the invention is particularly pointed out and distinctly claimed in the concluding portions of the specification. The invention, however, both as to organization and the method of operation, together with objects, features and advantages thereof, may be best understood by a reference to the following detailed description when read with the accompanying drawings in which:

DETAILED DESCRIPTION

Figure 1:
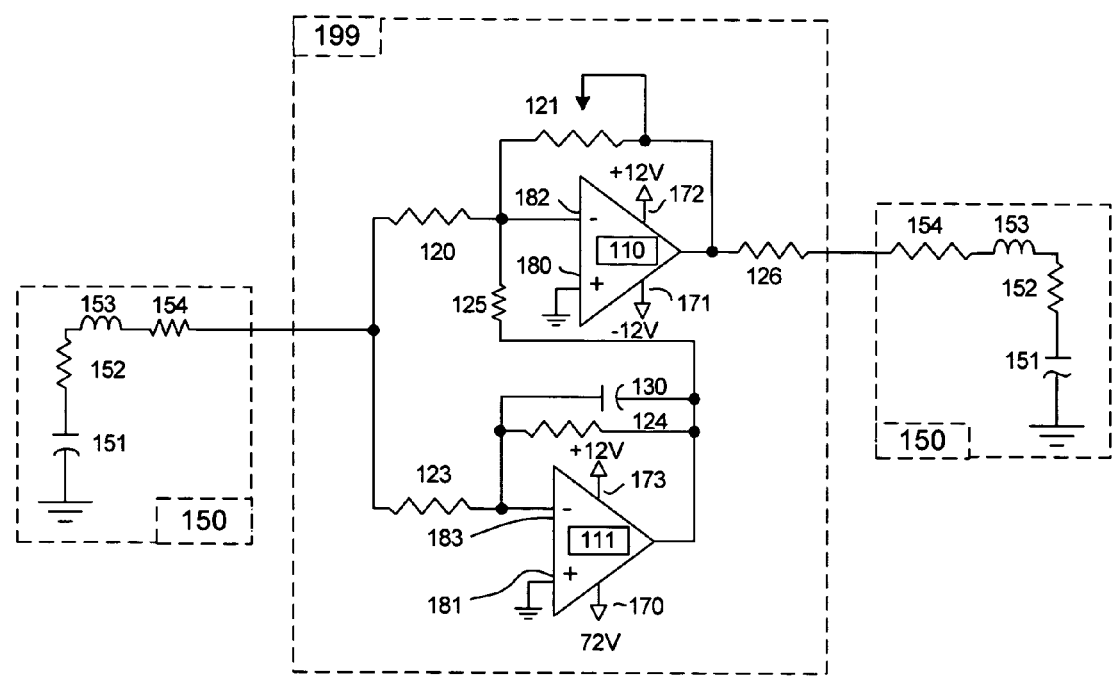
FIG. 1 is a schematic diagram illustrating one embodiment of an electromagnetic noise suppression device in accordance with the invention.

In the following detailed description, numerous details are set forth in order to provide a thorough understanding of the present invention. However, it will be understood by those skilled in the art that the present invention may be practiced without these specific details. In other instances, well-known methods, procedures, components, and circuits have not been described in detail so as to not obscure the present invention.

In this context, a heatsink comprises a device, at least one of whose primary functions is to dissipate heat. Typically a heatsink includes, but is not limited to, a mounting base, typically made of a heat conducting material, such as, for example, a metal, that dissipates, carries away, or radiates heat generated, usually within another device, into the ambient environment. Described below is an illustration, not intended to be limiting in anyway, of an application of this concept. For devices that produce a low amount of heat, the packaging of the device often serves as a heatsink. However, for higher-powered devices, a separate heatsink to which one or more packages are usually physically attached is typically desired and employed to reduce overheating and the risk of destruction of the device. Heatsink design typically employs a large surface area, often with fins, to thereby radiate heat to the ambient environment. Heatsinks are typically used with integrated circuit (IC) devices to reduce the possibility the destruction of the circuit's semiconductor junctions by maintaining a safe operating temperature or range of temperatures for the IC.

While heatsinks provide the beneficial function of absorbing and radiating heat from an electrical device, they often also perform the detrimental and undesirable function of absorbing and radiating EMI signals. To illustrate the concept, the following example may prove helpful. Of course, one skilled in the art will recognize that there are many other examples that may be used. In a computing system, EMI signals generated by a microprocessor, for example, may flow to the heatsink coupled to the microprocessor. The heatsink, effectively acting as an antenna, may radiate the received EMI signals. These radiated EMI signals may then degrade the performance of one or more electrical devices substantially within an affected range from the heatsink.

Typically, reduction of electromagnetic interference may occur through the application of passive technology, meaning, in this context, an inert component or method that may control, but not create or amplify, energy. One popular passive method includes the use of shielding to block the radiation of the EMI to other electrical devices. To continue the computing system example, a metal chassis or case may be used to house the electrical components of the system to shield external electrical devices from the EMI generated by the computing system. Another passive system might attempt to reduce the amount of EMI that is transmitted from the source of the interference to the device, that then radiates the EMI to other electrical devices. Again, to continue the computing system example, although those skilled in the art will realize that there are many other examples, a special technique of coupling the heatsink to the microprocessor may be employed to reduce the amount of EMI received by the heatsink. An example of such a special technique of coupling the heatsink to the microprocessor may involve embedding a non-compressible mesh in the thermal coupling between the microprocessor and the heatsink, in order to increase the electrical insulation between the microprocessor and the heatsink. A third popular passive method is to electrically ground the device radiating the EMI. This would prevent at least a portion of the EMI from being transmitted to the electrical device where performance may ultimately be degraded.

While these passive techniques are typically inexpensive, at times they are ineffective or have been determined to provide only limited success at reducing EMI signals. These methods, for example, may have inherent bandwidth limits and/or resonant points which may limit the frequencies of EMI signals that are capable of being reduced. In addition, if the source of the EMI signals is changed, due to a processor upgrade, for example, often a complete redesign of the passive method may be desirable.

An active technique of reducing EMI signals may include the following. EMI signals from a radiating device, such as, for example, a heatsink may be received. The received EMI signals may be substantially inverted. The inverted EMI signals may be transmitted to the radiating device.

Two interacting electromagnetic signals of substantially equal amplitude but opposite magnitude, should nearly, if not completely, cancel each other. Therefore, a device capable of generating such a signal may be employed to effectively reduce EMI signals. Unlike passive approaches which are frequently designed or tuned for specific EMI signals, such an approach, which may actively adjust to reduce a variety of EMI signals, may avoid or at least reduce the incidence of a redesign if the source of the EMI signals is altered, such as due to a processor upgrade, for example. Likewise, such an embodiment may include the capability to reduce EMI signals with a much wider effective frequency range than the known passive techniques, such as those previously described.

Figure 2:
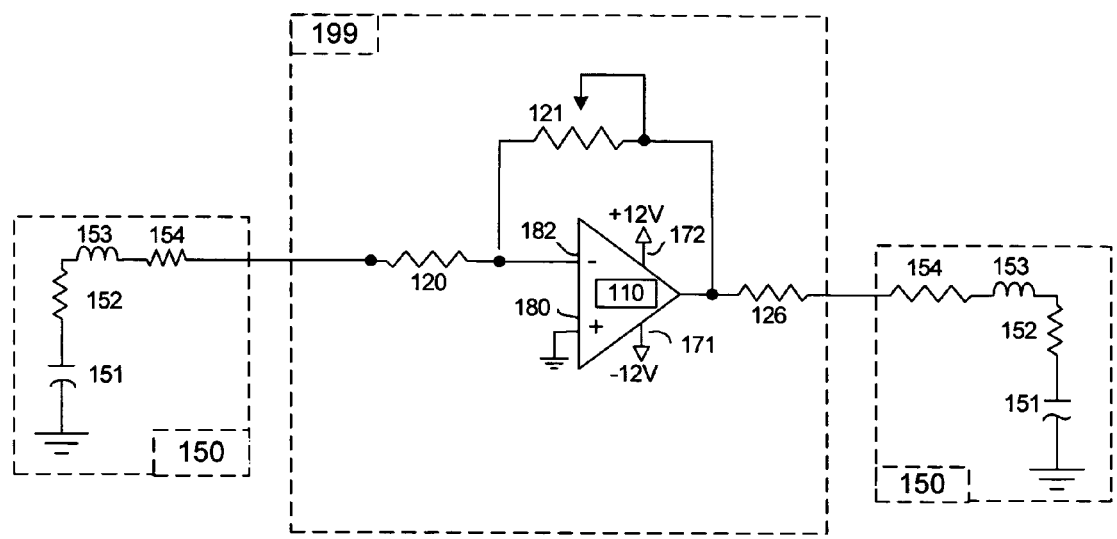
FIG. 2 is a schematic diagram illustrating another embodiment of an electromagnetic noise suppression device in accordance with the invention.

FIG. 1 is a schematic diagram illustrating embodiment 100 of an electromagnetic noise reduction device in accordance with the invention. Embodiment 100 includes circuit configuration 199 to measure and at least partially reduce electromagnetic interference (EMI) signals received from heatsink 150. In this particular embodiment, high-frequency EMI signals, such as those generated as a result of IC clock, logic, and bus switching, for example, are substantially targeted for reduction in this embodiment; however, the invention is not limited in scope in this respect. Low-pass frequency EMI signals, such as those generated as a result of power supply spikes, are not specifically targeted for reduction in this embodiment, but may be in other embodiments. FIG. 2, in contrast, illustrates an alternate embodiment of the invention, which does not substantially target high-pass EMI signals. Again, the invention is, of course, not limited to these two particular embodiments.

In the particular embodiment shown in FIG. 1, heatsink 150 is shown twice in FIG. 1 for reasons of convenience. In the particular embodiment, one heatsink is employed. Likewise, resistors 152 & 154, capacitor 151, and inductor 153 shown in heatsink 150 are merely convenient approximations or representations of the distributed properties of the heatsink used for purposes of illustration. Of course, a heatsink typically will not include an actual resistor, capacitor and/or inductor components, as such.

It is noted that FIG. 1, illustrates an implementation of a circuit configuration in accordance with the invention, but the invention is not restricted to this particular embodiment. The first-circuit stage of the embodiment comprises operational-amplifier (op-amp) 111, coupled with resistors 123 & 124 and capacitor 130 so as to form a low-pass filter, although any low pass filter may prove suitable. A low-pass filter substantially passes frequencies below a certain cutoff threshold and substantially attenuates frequencies substantially above that threshold. It is noted that the invention is not required to have a circuit one of whose primary functions is frequency filtering.

Op-amp 111 is powered by application of power at terminals 173 & 170. FIG. 1 illustrates a power supply of ±12 volts. The invention is not limited to ±12 volts, and one skilled in the art will quickly realize that a variety of voltages and power sources may be used to power op-amp 111. For example, it may be possible to utilize power from a fan coupled to heatsink 150. In this embodiment, the positive terminal 181 of op-amp 111 is grounded, and the negative terminal 183 of op-amp 111 is coupled so as to receive EMI signals from heatsink 150.

The second stage circuit of the embodiment shown in FIG. 1 comprises op-amp 110 coupled so as to sum the signals received from heatsink 150 via resistor 120 and the output signal of op-amp 111 via resistor 125. Feedback is provided via resistor 121. The output signal of op-amp 110 is transmitted via resistor 126 to heatsink 150. It should be recognized that the invention is not limited to the use of an op-amp. A variety of integrated or discrete analog and/or digital components may be utilized to invert the received EMI signal and the invention is not limited in scope to a particular type of component or a particular combination of components.

Op-amp 110 is powered by application of power at terminals 172 & 171. FIG. 1 illustrates a power supply of ±12 volts. Again, the invention is not limited to ±12 volts, and one skilled in the art will quickly realize that a variety of voltages and power sources may be used to power op-amp 110. For example, as previously indicated, it may be possible to utilize power from a fan coupled to heatsink 150. In this particular embodiment, for example, the positive terminal 180 of op-amp 110 is grounded, and the negative terminal 182 of op-amp 110 is coupled so as to receive EMI signals from heatsink 150, and to receive signals from the output signal from op-amp 111 via resistor 125.

In operation, for the particular embodiment shown in FIG. 1, EMI signals are received from heatsink 150. In the first circuit stage of the embodiment in FIG. 1, EMI signals are low-pass filtered. It is noted, while this particular embodiment contains a low-pass filter, that the invention is not required to contain a filter circuit in any form. An op-amp may be used because of wide bandwidth, low noise, and low output impedance characteristics, although, again the invention is not limited in scope in this respect.

The first stage circuitry provides the second stage with an inverted low frequency version of the received EMI signals. Therefore, the desired phase shift provided by op-amp 111 is approximately 180°. To achieve a unity gain, resistors 123 and 124 may be set to substantially equivalent values or electrically resistive properties tantamount to each other. To achieve an inversion of the input signal, in this embodiment, the input signal is applied to inverting terminal 183 of op-amp 111. In this embodiment, the value of capacitor 130 may be changed to set the desired frequency threshold of the filter. Again, may other approaches are suitable.

In this embodiment, the second stage circuit filters out the low frequency elements of the received EMI signals and provides the inversion of the received EMI signals. Inverted low frequency EMI signals, transmitted via resistor 125, are added to substantially unmodified EMI signals, transmitted via resistor 120, although, of course, the invention is not limited in scope in this respect. This creates a signal substantially comprising the high frequency components of the EMI signal received by heatsink 150. This signal is applied to the inverting terminal of op-amp 110.

The second stage circuit provides heatsink 150 with an inverted high-frequency version of the received EMI signals. Therefore, the desired phase shift provided by op-amp 111 is approximately 180°. To achieve this the values of resistors 120 and 121 should be substantially equal. However, the value of resistor 121 may be adjusted for higher gain to compensate for loss, such as, due to circuit parasitics and heatsink interconnect, for example.

This inverted high frequency version of the EMI signals received from the heatsink 150 may then be transmitted back to the same heatsink via resistor 126. Resistor 126 may be a low value and may be used to improve the stability of the circuit. In the particular embodiment illustrated in FIG. 1, the high-frequency components of the received EMI signal and the inverted high-frequency EMI signals interact they may at least partially and nearly completely offset each other out. Therefore, EMI radiated by the heatsink to other electrical devices may be substantially reduced as a result.

FIG. 2 illustrates an embodiment of the invention without the first stage filtering circuit of FIG. 1. In the embodiment illustrated in FIG. 2, the received EMI signal is inverted by the invention without substantial filtering or modification. When the received EMI signal and the inverted EMI signals interact, they may again at least partially and nearly completely offset each other out. Therefore, here too, EMI radiated by the heatsink to other electrical devices may be substantially reduced.

Figure 3:
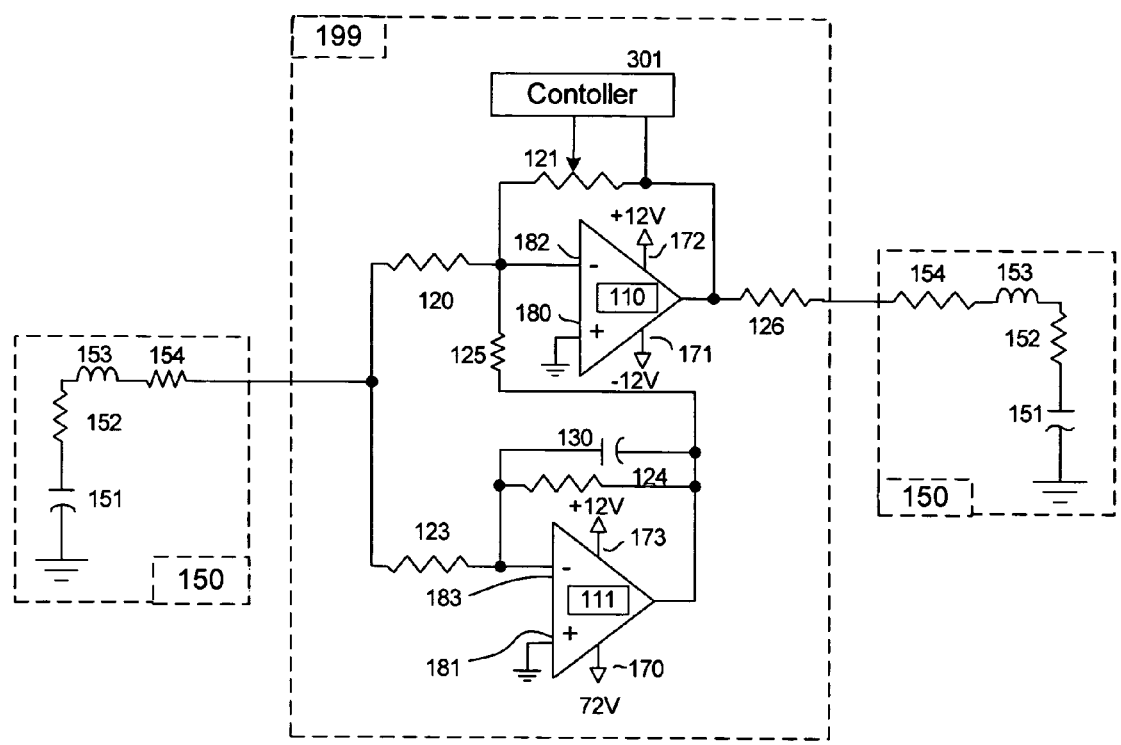
FIG. 3 is a schematic diagram illustrating a third embodiment of an electromagnetic noise suppression device in accordance with the invention.

FIG. 3 shows an embodiment of the invention in which the amplification of the inverted EMI signal may be dynamically adjusted via controller 301. The gain of op-amp 110, is dynamically adjusted by controller 301 by modifying the value of resistor 121. It is noted that the invention is not limited to any particular technique to dynamically adjust the amplification of the inverted EMI signal. For example, one skilled in the art may be aware of a variety of techniques to dynamically adjust, for example, the amount of frequency filtering involved in reducing EMI signals radiated by the heatsink to other electrical devices. All such techniques for dynamically adjusting the EMI signals are within the scope of the present invention.

Figure 4:
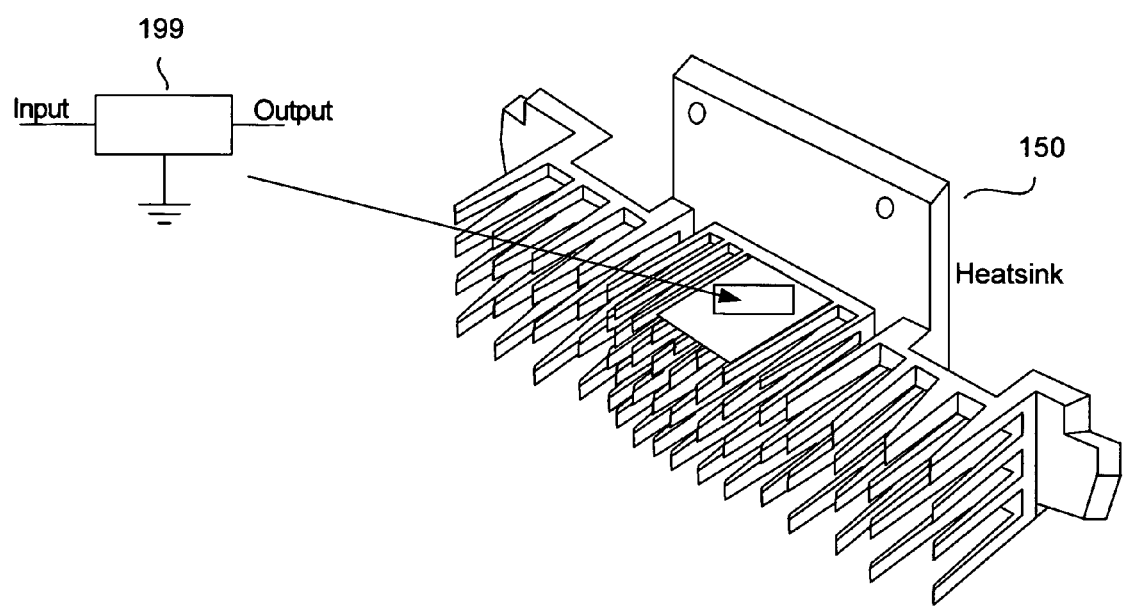
FIG. 4 is a perspective diagram illustrating an alternative embodiment in accordance with the invention where an embodiment of an electromagnetic noise reduction device in accordance with the invention is integrated with a heatsink.

FIG. 4 shows an embodiment of the invention in which circuit 199, as shown, in one embodiment, for example, in FIG. 1, is coupled to heatsink 150. Heatsink 150 and circuit 199, for example, may be integrated to form an individual component. In an alternate embodiment, although, again, the invention is not limited in scope in this respect, a variety of passive techniques of reducing EMI signals may be combined with an active technique. For example, although those skilled in art will appreciate that other examples exist, coupling the heatsink to a microprocessor may involve embedding a non-compressible mesh in the thermal coupling between the microprocessor and the heatsink, in order to increase the electrical insulation between the microprocessor and the heatsink. In addition, an active technique in accordance with the invention, such as one of the embodiments previously described, for example, may also be used to reduce EMI signals with a passive technique of EMI reduction.

Figure 5:
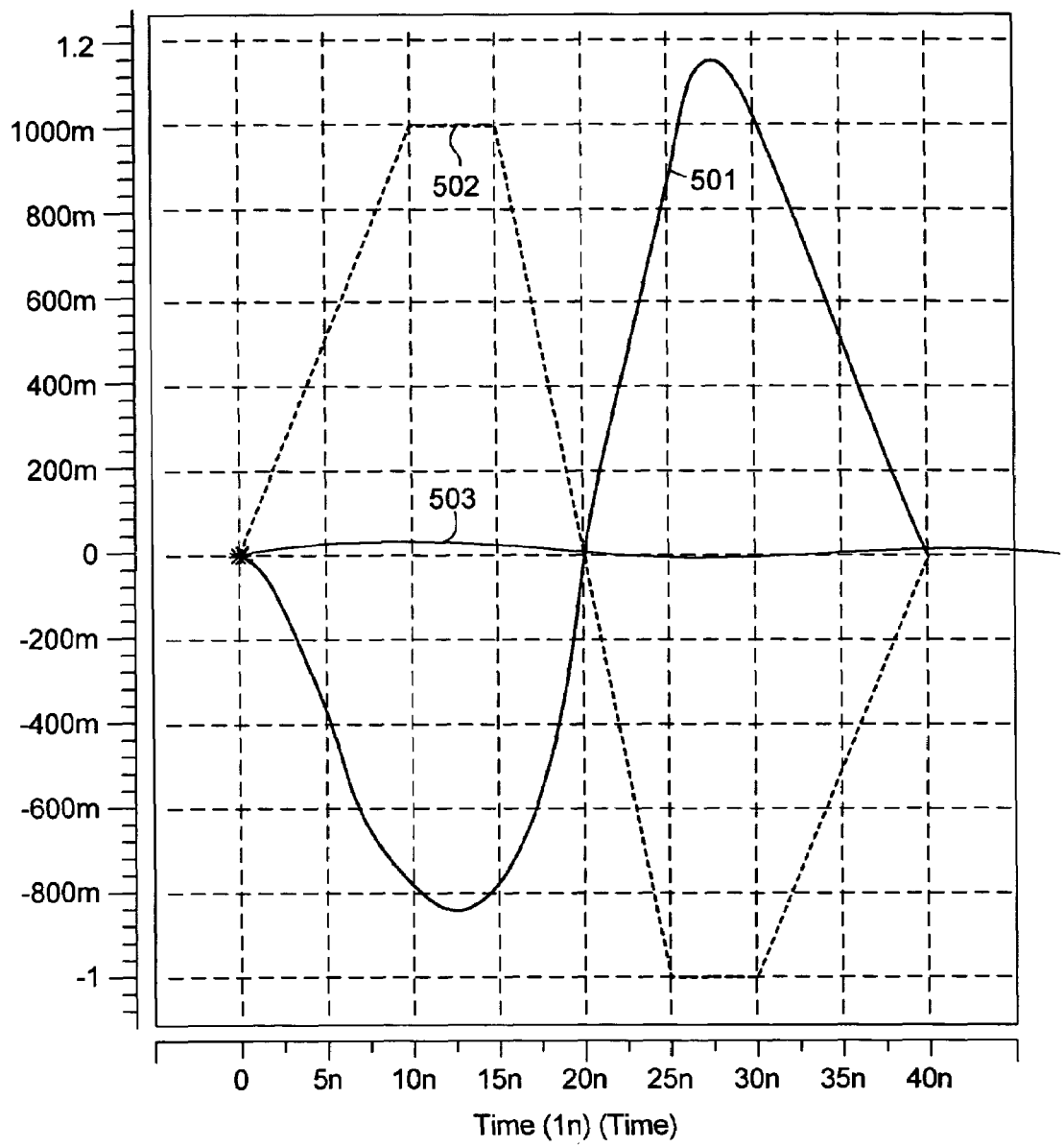
FIG. 5 is a graph illustrating a voltage signal that may be produced by the embodiments shown in FIGS. 1-3.

FIG. 5 shows applied EMI signal 501 generated by a "noisy" electrical device and transmitted to a heatsink, such as one of the types shown in FIG. 1. Sample inverted EMI signal 502 generated by an embodiment of the invention is also shown. The resulting superposition, signal 503, radiated by the heatsink, is also shown.

An additional embodiment of the invention may include a computing platform coupled with a heatsink and a circuit, as shown, in one embodiment, for example, in circuit 199 in FIG. 1. In this embodiment, a computing platform may include a component to process instructions and a memory to store instructions. In this particular embodiment of the invention, the heatsink and circuit may be coupled to at least partly reduce EMI signals produced by said computing platform.

While certain features of the invention have been illustrated and described herein, many modifications, substitutions, changes, and equivalents will now occur to those skilled in the art. It is, therefore, to be understood that the appended claims are intended to cover all such modifications and changes that fall within the true spirit of the invention.

The invention claimed is:

1. An apparatus comprising:
   a computing platform, said computing platform to generate heat and electromagnetic interference (EMI) signals;
   a heatsink integrated with said computing platform wherein an incompressible mesh is embedded in a thermal coupling between said computing platform and said heatsink to increase an electrical insulation between said computing platform and said heatsink, said heatsink to absorb said heat and said EMI signals;
   a circuit integrated with said heatsink, said circuit to receive said EMI signals, said circuit comprising a first stage and a second stage, said first stage to filter said received EMI signals into a low frequency component and a high frequency component, said second stage to invert said filtered EMI signals, said circuit to transmit said inverted EMI signals back to said heatsink, said heatsink to radiate said heat and a sum of said received and inverted EMI signals to an ambient environment; and
   a controller integrated with said circuit, said controller to dynamically adjust an amplification of said inverted EMI signals.

2. The apparatus of claim 1 wherein said computing platform comprises a component to process instructions and a memory to store instructions.

3. The apparatus of claim 1 wherein said computing platform comprises a microprocessor.

4. The apparatus of claim 1 wherein said ambient environment comprises other electrical devices.

5. The apparatus of claim 4 further comprising a metal chassis or case to shield said other electrical devices from said EMI signals generated by said computing platform.

6. The apparatus of claim 1 wherein said heatsink further comprises a packaging of said computing platform.

7. The apparatus of claim 1 wherein said computing platform is electrically grounded.

8. The apparatus of claim 1 wherein said circuit comprises an op-amp.

9. The apparatus of claim 1 wherein said circuit comprises discret components.

10. The apparatus of claim 1 wherein said circuit comprises analog components.

* * * * *